United States Patent
Zafiropoulo

(10) Patent No.: US 9,583,337 B2
(45) Date of Patent: Feb. 28, 2017

(54) OXYGEN RADICAL ENHANCED ATOMIC-LAYER DEPOSITION USING OZONE PLASMA

(71) Applicant: Ultratech, Inc., San Jose, CA (US)

(72) Inventor: Arthur W. Zafiropoulo, Atherton, CA (US)

(73) Assignee: Ultratech, Inc., San Jose, CA (US)

(*) Notice: Subject to any disclaimer, the term of this patent is extended or adjusted under 35 U.S.C. 154(b) by 25 days.

(21) Appl. No.: 14/601,944

(22) Filed: Jan. 21, 2015

(65) Prior Publication Data
US 2015/0279665 A1    Oct. 1, 2015

Related U.S. Application Data

(60) Provisional application No. 61/970,820, filed on Mar. 26, 2014.

(51) Int. Cl.
| | | |
|---|---|---|
| *C23C 16/40* | (2006.01) | |
| *H01L 21/02* | (2006.01) | |
| *C23C 16/455* | (2006.01) | |
| *C23C 16/507* | (2006.01) | |

(52) U.S. Cl.
CPC ...... *H01L 21/02274* (2013.01); *C23C 16/401* (2013.01); *C23C 16/405* (2013.01); *C23C 16/45536* (2013.01); *C23C 16/507* (2013.01); *H01L 21/0228* (2013.01); *H01L 21/02164* (2013.01); *H01L 21/02175* (2013.01)

(58) Field of Classification Search
CPC ........ C23C 16/45525; C23C 16/45536; C23C 16/45538; C23C 16/40
See application file for complete search history.

(56) References Cited

U.S. PATENT DOCUMENTS

| | | |
|---|---|---|
| 6,933,011 B2 | 8/2005 | Senzaki |
| 7,128,787 B2 | 10/2006 | Castovillo et al. |
| 7,205,247 B2 | 4/2007 | Lee et al. |
| 7,407,876 B2 | 8/2008 | Ishizaka |
| 8,163,087 B2 | 4/2012 | Faguet et al. |
| 8,168,375 B2 | 5/2012 | Nakajima et al. |
| 8,336,490 B2 | 12/2012 | Matsuura et al. |
| 8,486,845 B2 | 7/2013 | Matsuda |

(Continued)

FOREIGN PATENT DOCUMENTS

EP    2481830 A1    8/2012

OTHER PUBLICATIONS

Niskanen, Antti, et al., "Radical Enhanced Atomic Layer Deposition of Tantalum Oxide". Chem. Mater. 2007, 19, 2316-2320.*

(Continued)

*Primary Examiner* — Bret Chen
(74) *Attorney, Agent, or Firm* — Opticus IP Law PLLC

(57) ABSTRACT

A method of performing an oxygen radical enhanced atomic-layer deposition process on a surface of a substrate that resides within an interior of a reactor chamber is disclosed. The method includes forming an ozone plasma to generate oxygen radicals O*. The method also includes feeding the oxygen radicals and a precursor gas sequentially into the interior of the reactor chamber to form an oxide film on the substrate surface. A system for performing the oxygen radical enhanced atomic-layer deposition process is also disclosed.

15 Claims, 2 Drawing Sheets

(56) References Cited

U.S. PATENT DOCUMENTS

| | | | |
|---|---|---|---|
| 2003/0140671 A1* | 7/2003 | Lande | B05D 1/265 72/46 |
| 2004/0020601 A1* | 2/2004 | Zhao | H01L 21/02126 156/345.32 |
| 2005/0239297 A1 | 10/2005 | Senzaki et al. | |
| 2006/0051505 A1* | 3/2006 | Kortshagen | B82Y 30/00 427/212 |
| 2006/0054184 A1* | 3/2006 | Mozetic | B08B 7/0035 134/1.1 |
| 2006/0063346 A1* | 3/2006 | Lee | C23C 16/45531 438/393 |
| 2006/0276018 A1* | 12/2006 | Nam | H01L 21/76832 438/585 |
| 2009/0056877 A1 | 3/2009 | Matsuura et al. | |
| 2010/0075067 A1* | 3/2010 | Kim | C23C 16/45553 427/576 |
| 2011/0143053 A1* | 6/2011 | Shirahata | C23C 16/407 427/576 |
| 2011/0151619 A1* | 6/2011 | Orita | C23C 16/407 438/104 |
| 2011/0183079 A1 | 7/2011 | Jackson et al. | |
| 2012/0021590 A1* | 1/2012 | Ishii | C23C 16/305 438/478 |
| 2012/0255612 A1* | 10/2012 | Pierreux | H01L 21/02178 136/261 |
| 2013/0012033 A1 | 1/2013 | Kabe et al. | |
| 2013/0125815 A1 | 5/2013 | Liu et al. | |
| 2013/0216708 A1* | 8/2013 | Yun | C23C 16/4481 427/248.1 |
| 2013/0295779 A1 | 11/2013 | Chandra et al. | |
| 2013/0313657 A1* | 11/2013 | Tong | H01L 21/02181 257/411 |

OTHER PUBLICATIONS

Edy, Riyanto, et al., "Influence of argon plasma on the deposition of Al2O3 film onto the PET surfaces by atomic layer deposition". Nanoscale Research Letters, 2013, 8:79, pp. 1-9.*

Sundstrom, Hans, et al., "Ozone as the Oxidizing Precursor in Atomic Layer Deposition". Gas & Chemicals, Dec. 2005, www.eurosemi.eu.com, G1-G3.*

Niskanen, Antti, et al., "Radical Enhanced Atomic Layer Deposition of Titanium Dioxide". Chemical Vapor Deposition, 2007, 13, 152-157.*

George, "Atomic Layer Deposition: An Overview," Chem. Rev. 2010, 110, pp. 111-131 (published on the web on Nov. 20, 2009).

Niskanen, "Radical enhanced atomic layer deposition of metals and oxides," Academic Dissertation, University of Helsinki, Nov. 10, 2006.

Sundstrom, "Ozone as the oxidizing precursor in atomic layer deposition," Gas & Chemicals G1, www.eurosemi.eu.com Dec. 2005.

Vandenbroucke, "Modeling and experimental validation of TCE abatement and ozone formation with non thermal plasma," 8th International Symposium on Non-Thermal/Thermal Plasma Pollution Control Technology and Sustainable Energy, Proceedings, 2012.

Werner, "High-rate atomic layer deposition of Al2O3 for the surface passivation of Si solar cells," Energy Procedia 8 (2011) pp. 301-306.

Office Action from Japanese Patent office dated Feb. 26, 2016, for Japanese counterpart Patent Application No. 2015-022812.

* cited by examiner

OXYGEN RADICAL ENHANCED ATOMIC-LAYER DEPOSITION USING OZONE PLASMA

CROSS-REFERENCE TO RELATED APPLICATIONS

This application claims priority under 35 U.S.C. §119(e) of U.S. Provisional Patent Application Ser. No. 61/970,820, filed on Mar. 26, 2014, and which is incorporated herein by reference.

FIELD

The present disclosure relates to atomic-layer deposition (ALD), and in particular relates to oxygen radical enhanced ALD, wherein an ozone plasma is used to generate the oxygen radicals.

The entire disclosure of any publication or patent document mentioned herein is incorporated by reference.

BACKGROUND

Atomic layer deposition (ALD) is a method of depositing a thin film on a substrate in very controlled manner. The deposition process is controlled by using two or more chemicals ("precursors") in vapor form and reacting them sequentially and in a self-limiting manner on the substrate surface. The sequential process is repeated to build up the thin film layer by layer, wherein the layers are atomic scale.

ALD is used to form a wide variety of films, such as binary, ternary and quaternary oxides for advanced gate and capacitor dielectrics, as well as metal-based compounds for interconnect barriers and capacitor electrodes. An overview of the ALD process is presented in the article by George, entitled "Atomic Layer Deposition: an Overview," Chem. Rev. 2010, 110, pp 111-113 (published on the Web on Nov. 20, 2009).

One type of ALD is called radical enhanced ALD (RE-ALD). RE-ALD utilizes radicals generated by a plasma to form one of the precursor gases. Because a radicalized precursor tends to be more reactive than its unradicalized counterpart, it helps induce the reactions when forming the film layers.

The type of plasma used in RE-ALD is referred to by the name of the feedgas used to form the plasma. For example, an "oxygen plasma" utilizes oxygen ($O_2$) as the feedgas to produce a plasma that generates oxygen-radicals precursors. The oxygen-radical precursors comprise monatomic oxygen, which has two unpaired electrons that make monatomic oxygen very reactive. The oxygen radicals serve as co-reactants that are used in conjunction with a second precursor (say, Si). The two precursors are feed sequentially into the reactor chamber to produce sequential layers that lead to thin film growth (e.g., $SiO_2$).

While ALD has many advantages, one of its major disadvantages as compared to other film growth processes (such as chemical-vapor deposition or CVD) is that it is quite slow. For example, a conventional ALD reactor has a growth rates measured in angstroms/minute, while CVD has growth rates measured in microns/minute. Slow growth rates result in excellent film quality but limit the throughput of processed substrates (wafers) in a semiconductor manufacturing line. Thus, while an oxygen plasma is effective in providing oxygen-radical precursors for oxygen-based RE-ALD, there is always a need to increase the speed and/or efficiency of an oxygen-based RE-ALD process.

SUMMARY

An aspect of the disclosure is a method of performing a radical enhanced atomic-layer deposition (RE-ALD) process on a surface of a substrate that resides within an interior of a reactor chamber. The method includes: forming an ozone plasma to generate oxygen radicals ($O^*$); and sequentially feeding the oxygen radicals and a precursor gas into the interior of the reactor chamber to form an oxide film on the substrate surface.

Another aspect of the disclosure is the method described above, wherein the ozone plasma is inductively formed within a plasma tube that is operably (e.g., pneumatically) coupled to the interior of the reactor chamber.

Another aspect of the disclosure is the method described above, wherein the precursor gas comprises a metal organic precursor.

Another aspect of the disclosure is the method described above, wherein the metal organic precursor is selected from the group comprising: silicon, aluminum, hafnium, titanium, zirconium, tantalum, yttrium and magnesium.

Another aspect of the disclosure is the method described above, wherein the oxide film comprises a metal oxide.

Another aspect of the disclosure is the method described above, wherein the metal oxide is selected from the group comprising: $SiO_2$, $Al_2O_3$, $HfO_2$, $TiO_2$, $ZrO_2$, $Ta_2O_5$, $Y_2O_3$ and $Mg_2O_4$.

Another aspect of the disclosure is the method described above, including introducing a purge gas into the interior of the reactor chamber to assist in purging the interior of the reactor chamber.

Another aspect of the disclosure is the method described above, wherein the generating of the oxygen radicals $O^*$ includes dissociating an ozone molecule to form diatomic oxygen molecule $O_2$ and a first oxygen radical $O^*$, and then dissociating the diatomic oxygen molecule $O_2$ to form second and third oxygen radicals $O^*$.

Another aspect of the disclosure is the method described above, wherein the substrate comprises a silicon wafer.

Another aspect of the disclosure is a method of performing a RE-ALD process on a surface of a substrate that resides within an interior of a reactor chamber. The method includes: providing a first precursor gas comprising oxygen radicals $O^*$ by forming an ozone plasma from ozone gas within a plasma tube, wherein the plasma tube is pneumatically coupled to the interior of the reactor chamber; providing a second precursor gas from a gas source that is pneumatically coupled to the interior of the reactor chamber; and sequentially introducing the first precursor gas and the second precursor gas into the interior of the reactor chamber to form an oxide film on the substrate surface.

Another aspect of the disclosure is the method described above, wherein one of the first and second precursor gases comprises at least one of: silicon, aluminum, hafnium, titanium, zirconium, tantalum, yttrium and magnesium.

Another aspect of the disclosure is the method described above, wherein the oxide film comprises one of: $SiO_2$, $Al_2O_3$, $HfO_2$, $TiO_2$, $ZrO_2$, $Ta_2O_5$, $Y_2O_3$ and $Mg_2O_4$.

Another aspect of the disclosure is the method described above, including introducing a purge gas into the interior of the reactor chamber to assist in purging the interior of the reactor chamber.

Another aspect of the disclosure is the method described above, wherein the substrate comprises a silicon wafer.

Another aspect of the disclosure is the method described above, wherein the plasma tube is made of quartz.

Another aspect of the disclosure is the method described above, wherein forming the ozone plasma includes subjecting the ozone in the plasma tube to inductive coupling.

Another aspect of the disclosure is the method described above, wherein forming the oxygen radicals O* includes: dissociating an ozone molecule to form diatomic oxygen molecule $O_2$ and a first oxygen radical O*; and dissociating the diatomic oxygen molecule $O_2$ to form second and third oxygen radicals O*.

Another aspect of the disclosure is a system for performing a RE-ALD process on a surface of a substrate. The system includes: a reactor chamber having an interior configured to support the substrate; an ozone plasma system pneumatically connected to the interior of the reactor chamber and configured to form an ozone plasma that generates oxygen radicals O*; a gas source pneumatically coupled to the interior of the reactor chamber and that contains a gas; a vacuum pump pneumatically connected to the interior of the reactor chamber; and a controller operably connected to the ozone plasma system, the vacuum pump and the gas source. The controller is configured to introduce the oxygen radicals and the gas sequentially into the interior of the reactor chamber to form an oxide film on the substrate surface.

Another aspect of the disclosure is the system described above, wherein the ozone plasma system forms the oxygen radicals O* by dissociating an ozone molecule to form diatomic oxygen molecule $O_2$ and a first oxygen radical O*, and then dissociating the diatomic oxygen molecule $O_2$ to form second and third oxygen radicals O*.

Another aspect of the disclosure is the system described above, wherein the gas includes one of: silicon, aluminum, hafnium, titanium, zirconium, tantalum, yttrium and magnesium.

Another aspect of the disclosure is the system described above, wherein the plasma system includes an inductively coupled plasma source.

Another aspect of the disclosure is the system described above, further comprising the substrate, wherein the substrate comprises silicon.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

In the discussion herein, an oxygen radical is denoted as O* and represents monatomic oxygen, which has a total of six electrons, two of which are unpaired. The unpaired electrons make O* very reactive, i.e., more reactive than ozone ($O_3$), which is more reactive than diatomic oxygen ($O_2$).

In the discussion below, oxygen radicals O* constitute a first precursor gas that serves as an oxidizing precursor, while a second precursor gas is a non-oxide gas that forms, in combination with the first precursor gas, a thin-film oxide compound on a substrate surface.

Figure 1:
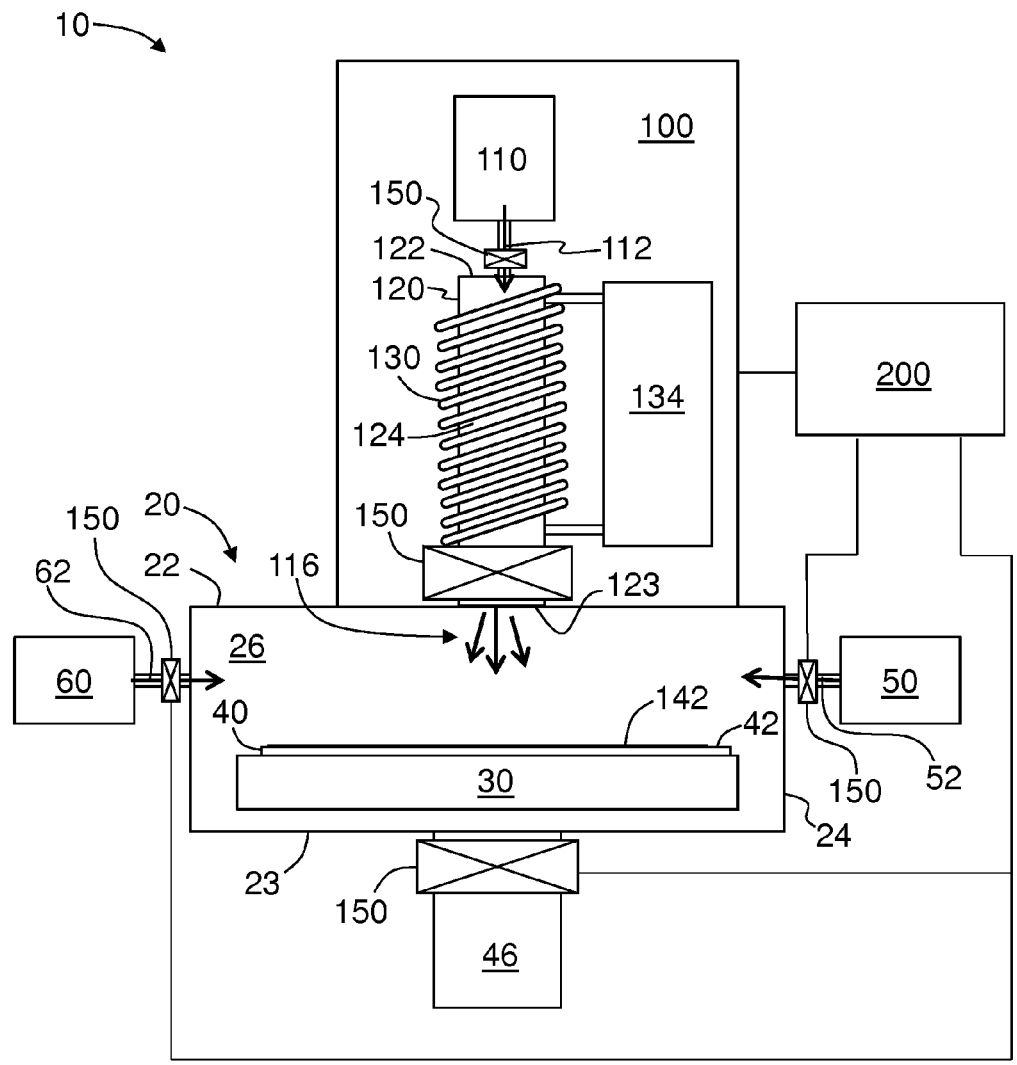
FIG. 1 is a schematic diagram of an example RE-ALD system used to carry out the RE-ALD methods disclosed herein that employ and ozone plasma to generate a precursor gas having monotomic oxygen radicals.

FIG. 1 is a schematic diagram of an example RE-ALD system 10. Various configurations for RE-ALD system 10 are possible, and the RE-ALD system 10 of FIG. 1 shows one basic configuration that can be employed. RE-ALD system 10 includes a reactor chamber 20 having a top wall 22, a bottom wall 23 and a cylindrical sidewall 24 that define a reactor chamber interior 26. A stage 30 resides within reactor chamber interior 26. Stage 30 supports a substrate 40 that has an upper surface 42 on which an oxide film 142 is formed via a RE-ALD process as discussed below. An example substrate 40 is a silicon wafer used in semiconductor manufacturing. A vacuum pump 46 is pneumatically connected to reactor chamber interior 26 and serves to control the pressure within the reactor chamber interior (e.g., in the range of about 100 mTorr to about 500 mTorr).

RE-ALD system 10 also includes precursor gas source 50 that is pneumatically connected to reactor chamber interior 26 and that provides a precursor gas 52 to the reactor chamber interior as part of the RE-ALD process. In an example, precursor gas 52 is any gas that combines with oxygen to form oxide layer 142 on wafer surface 42. Example first precursor gases include: silicon (e.g., to form $SiO_2$), aluminum (e.g., to form $Al_2O_3$), hafnium (e.g., to form $HfO_2$), titanium (e.g., to form $TiO_2$), zirconium (e.g., to form $ZrO_2$), tantalum (to form $Ta_2O_5$), Yttrium (e.g., to form $Y_2O_3$) and magnesium (e.g., to form $Mg_2O_4$).

RE-ALD system 10 further includes an optional second gas source 60 that is pneumatically connected to reactor chamber interior 26 and that provides an inert gas 62 to the reactor chamber interior. Inert gas 62 serves as a purge gas between introducing the different precursor gasses to speed up the sequential layering processes when forming oxide film 142. Note that the second gas source 60 can be combined with precursor gas source 50 so that the precursor gas 52 and the inert gas 62 can flow into reactor chamber interior 26 through the same conduit.

Figure 2:
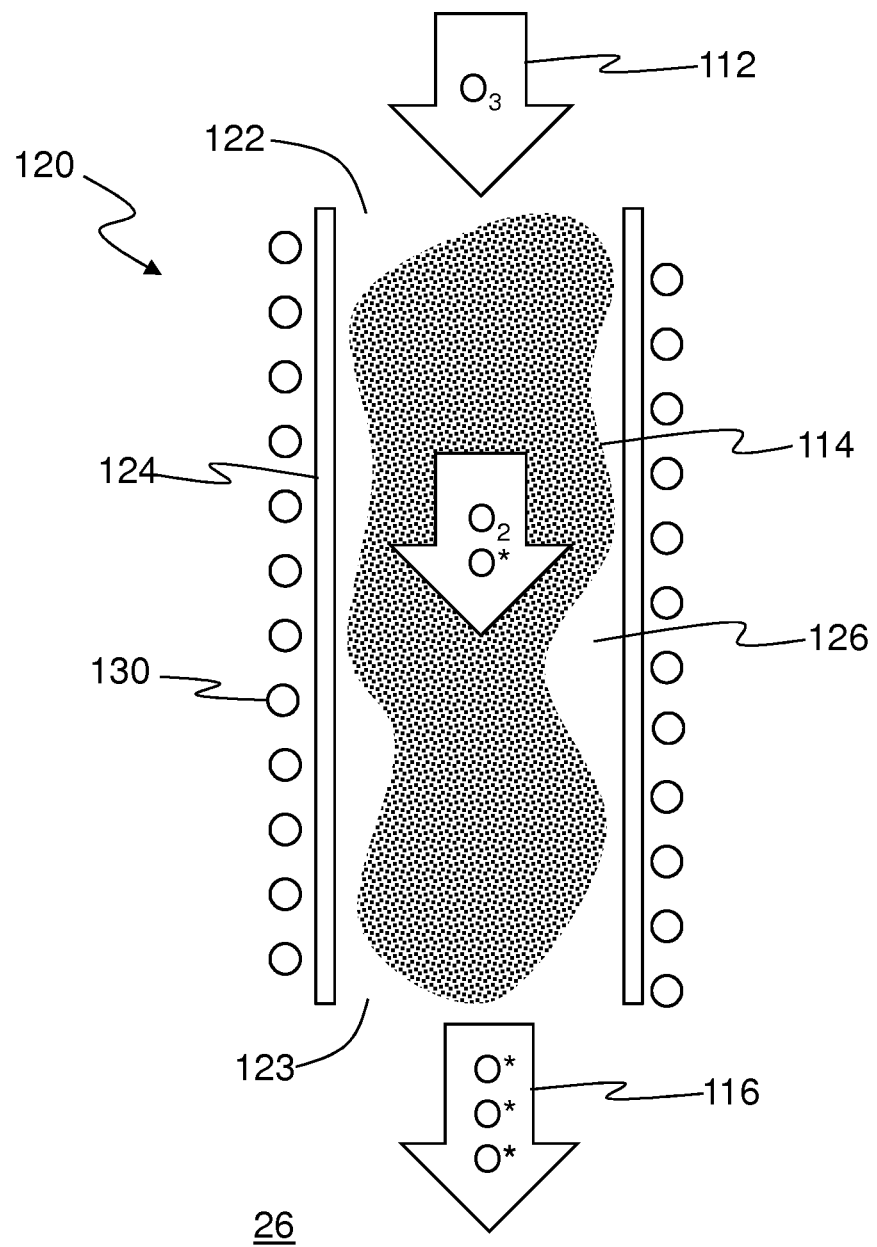
FIG. 2 is a close-up cross-sectional view of the ozone plasma system of the RE-ALD system of FIG. 1 illustrating how an ozone molecule $O_3$ is dissociated into three monatomic oxygen radicals (3O*) within the ozone plasma system.

RE-ALD system 10 also includes an ozone plasma system 100 that is pneumatically coupled to reactor chamber interior 26. FIG. 2 is a close-up cross-sectional view of a portion of an example ozone plasma system 100. Ozone plasma system 100 is configured to receive ozone gas 112 as a feedgas to form an ozone plasma 114. The ozone plasma 114 generates oxygen radicals O* that enter reactor chamber interior 26 and that constitute an oxidizing precursor gas 116.

An example ozone plasma system 100 includes an ozone gas source 110 that contains ozone gas 112. The ozone gas source 110 is pneumatically coupled to an input end 122 of a plasma tube 120. Plasma tube 20 also has output end 123, an outer surface 124 and an interior 126. An example plasma tube 120 is made of quartz and is substantially cylindrical. A radio-frequency (RF) coil 130 resides around outer surface 124 of plasma tube 120 and is operably connected to an RF source 134. The RE-ALD system 10 can include a number of valves 150 that are used to control the flow of precursor gas 52, inert purge gas 62, ozone gas 112, as well as the pneumatic connection of vacuum pump 46, to reactor chamber interior 26. The valve 150 at the output end of ozone gas source 100 adjacent reactor chamber 20 is optional and may not be required given the low pressure in reactor chamber interior 26.

The RE-ALD system 10 also includes a controller 200 operably connected to ozone plasma system 100 and valves 150. Controller 200 is configured to control the operation of the RE-ALD system to form oxide film 142 on substrate surface 42. In particular, controller 200 is configured to control the opening and closing of valves 150 as needed to perform the sequential introduction of precursor gases 116 and 52 into chamber interior 16, including the removal of one precursor gas before introducing the other precursor gas. In an example, controller 200 controls the introduction of purge gas 62 to assist in removing one of the precursor gases 116 or 52 from reactor chamber interior 26 prior to introducing the other precursor gas into the reactor chamber interior.

With reference to FIG. 2, ozone gas 112 enters the input end 122 of plasma tube 120 and travels into plasma tube interior 126. In the meantime, RF generator 134 provides RF coil 130 with an RF-frequency signal that inductively forms plasma 114 within the interior 126 of plasma tube 120. More specifically, as the ozone gas 112 flows towards output end 123, the RF energy from RF coil 130 drives azimuthal electrical currents in the (rarified) ozone gas, which initiates the formation of plasma 114. The initial plasma 114 is formed by the dissociation of ozone $O_3$ into diatomic oxygen $O_2$ and an oxygen radical O*. As plasma 114 continues to flow towards output end 123 of plasma tube 122, the azimuthal electrical currents break down the diatomic oxygen $O_2$ into two additional oxygen radials O*. See, e.g., Vandenbrouke et al., "Modeling and experimental validation of TCE abatement and ozone formation with non-thermal plasma," 8th International Symposium on Non-Thermal/Thermal Plasma Pollution Control Technology and Sustainable Energy Proceedings (ISNTP-8, 2012), June 2012. Because the output end 23 of plasma tube 20 is pneumatically connected to reactor chamber interior 126, and because the reactor chamber interior has a relatively low pressure, plasma 114 is drawn into the reactor chamber interior as precursor gas 116.

Thus, a single ozone atom in ozone gas 112 ends up forming three oxygen radicals O* (i.e., 3O*) that enter reactor chamber interior 26 as oxidizing precursor gas 116. This is in contrast to prior-art RE-ALD systems that utilize an oxygen plasma, wherein diatomic oxygen $O_2$ is the feedgas. A single diatomic oxygen molecule $O_2$ will only be able to generate two oxygen radicals O*. Thus, ozone plasma 114 can produce ⅓ more monatomic oxygen radicals O* than an oxygen plasma. The increased oxygen radical density increases the growth rate of oxide film 142.

Furthermore, since ozone $O_3$ is more reactive than diatomic oxygen $O_2$, the amount of energy it takes to generate the oxygen radicals O* is less on average for ozone plasma 114 than for an oxygen plasma. That is, the formation of oxygen radicals O* by the dissociative reaction $O_3+e^-\rightarrow O_2+O^*$ takes less energy than the formation of the oxygen radicals formed by the dissociative reaction $O_2+e^- 2O^*$. Also, the reaction $O_3+e^-\rightarrow O_2+O^*$ occurs at a rate of $1.9\times10^{-9}$ cm$^3$/s while the reaction $O_2+e^-\rightarrow 2O^*$ occurs at a rate of $8.6\times10^{-10}$ cm$^3$/s. The complete dissociation of ozone into three oxygen radicals O* produces oxygen radicals at greater than twice the rate when dissociating oxygen only.

Thus, with continuing reference to FIGS. 1 and 2, in an example method, RE-ALD is performed using RE-ALD system 10 wherein ozone plasma 114 generates oxygen radicals O* that constitute first precursor gas 116. The method then includes sequentially introducing the first precursor gas 116 and the second precursor gas 52 into interior 26 of reactor chamber 20 to form an oxide film 142 on wafer surface 42. The sequential introduction of the precursor gases is repeated to the extent needed to obtain a desired thickness for oxide film 142. As noted above, purge gas 62 can be employed to assist in purging reactor chamber interior 26 of one precursor gas before introducing the other precursor gas. It is noted that in FIG. 1, both precursor gases 116 and 52 as well as purge gas 62 are shown as being introduced at the same time into the reactor chamber interior 26 of reactor chamber 20 for ease of illustration.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of performing a radical enhanced atomic-layer deposition (RE-ALD) process on a surface of a substrate that resides within an interior of a reactor chamber, comprising:
    forming from ozone an ozone plasma to generate oxygen radicals O*, wherein the ozone plasma is inductively formed within a plasma tube that is pneumatically coupled to the interior of the reactor chamber, and wherein the oxygen radicals O* are formed at a rate greater than twice that as compared to using an oxygen plasma; and
    sequentially feeding the oxygen radicals and a precursor gas into the interior of the reactor chamber to form an oxide film on the substrate surface.

2. The method according to claim 1, wherein the precursor gas comprises a metal organic precursor.

3. The method according to claim 2, wherein the metal organic precursor is selected from the group comprising: silicon, aluminum, hafnium, titanium, zirconium, tantalum, yttrium and magnesium.

4. The method of claim 1, wherein the oxide film comprises a metal oxide.

5. The method of claim 4, wherein the metal oxide is selected from the group comprising: $SiO_2$, $Al_2O_3$, $HfO_2$, $TiO_2$, $ZrO_2$, $Ta_2O_5$, $Y_2O_3$ and $Mg_2O_4$.

6. The method of claim 1, including introducing a purge gas into the interior of the reactor chamber to assist in purging the interior of the reactor chamber of either the oxygen radicals or the precursor gas.

7. The method of claim 1, wherein the generating of the oxygen radicals O* includes dissociating an ozone molecule to form diatomic oxygen molecule $O_2$ and a first oxygen radical O*, and then dissociating the diatomic oxygen molecule $O_2$ to form second and third oxygen radicals O*.

8. The method of claim 1, wherein the substrate comprises a silicon wafer.

9. A method of performing a radical enhanced atomic-layer deposition (RE-ALD) process on a surface of a substrate that resides within an interior of a reactor chamber, comprising:
   providing a first precursor gas comprising oxygen radicals O* by forming an ozone plasma from ozone gas within a plasma tube by inductive coupling, wherein the plasma tube is pneumatically coupled to the interior of the reactor chamber, and wherein the oxygen radicals O* are formed at a rate greater than twice that as compared to using an oxygen plasma;
   providing a second precursor gas from a gas source that is pneumatically coupled to the interior of the reactor chamber; and
   sequentially introducing the first precursor gas and the second precursor gas into the interior of the reactor chamber to form an oxide film on the substrate surface.

10. The method according to claim 9, wherein one of the first and second precursor gases comprises at least one of: silicon, aluminum, hafnium, titanium, zirconium, tantalum, yttrium and magnesium.

11. The method of claim 9, wherein the oxide film comprises one of: $SiO_2$, $Al_2O_3$, $HfO_2$, $TiO_2$, $ZrO_2$, $Ta_2O_5$, $Y_2O_3$ and $Mg_2O_4$.

12. The method of claim 9, including introducing a purge gas into the interior of the reactor chamber to assist in purging the interior of the reactor chamber of either the first or precursor gas or the second precursor gas.

13. The method of claim 9, wherein the substrate comprises a silicon wafer.

14. The method of claim 9, wherein the plasma tube is made of quartz.

15. The method of claim 9, wherein forming the oxygen radicals O* includes:
   dissociating an ozone molecule to form diatomic oxygen molecule $O_2$ and a first oxygen radical O*; and
   dissociating the diatomic oxygen molecule $O_2$ to form second and third oxygen radicals O*.

* * * * *